(12) United States Patent
Betser et al.

(10) Patent No.: US 7,095,655 B2
(45) Date of Patent: Aug. 22, 2006

(54) DYNAMIC MATCHING OF SIGNAL PATH AND REFERENCE PATH FOR SENSING

(75) Inventors: Yoram Betser, Mazkeret Batya (IL); Eduardo Maayan, Kfar Saba (IL); Yair Sofer, Tel-Aviv (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 10/916,413

(22) Filed: Aug. 12, 2004

(65) Prior Publication Data

US 2006/0034122 A1 Feb. 16, 2006

(51) Int. Cl.
*G11C 16/06* (2006.01)
(52) U.S. Cl. ............................ 365/185.21; 365/185.11; 365/185.13; 365/185.2
(58) Field of Classification Search ...................... None
See application file for complete search history.

(56) References Cited

U.S. PATENT DOCUMENTS

| | | | |
|---|---|---|---|
| 4,342,102 A | 7/1982 | Puar | |
| 4,388,705 A | 6/1983 | Sheppard | |
| 4,389,705 A | 6/1983 | Sheppard | |
| 4,527,257 A | 7/1985 | Cricchi | |
| 4,667,217 A | 5/1987 | Janning | |
| 4,857,770 A | 8/1989 | Partovi et al. | |
| 4,961,010 A | 10/1990 | Davis | |
| 5,027,321 A | 6/1991 | Park | |
| 5,029,063 A | 7/1991 | Lingstaedt et al. | |
| 5,081,371 A | 1/1992 | Wong | |
| 5,142,495 A | 8/1992 | Canepa | |
| 5,142,496 A | 8/1992 | Van Buskirk | |

(Continued)

FOREIGN PATENT DOCUMENTS

EP 0693781 1/1996

(Continued)

OTHER PUBLICATIONS

Martin, "Improved Circuits for the Realization of Switched Capacitor Filters", IEEE Transactions on Circuits and Systems, Apr. 1980, pp. 237-244, vol. CAS-27.

(Continued)

*Primary Examiner*—Son Mai
(74) *Attorney, Agent, or Firm*—Eitan Law Group

(57) ABSTRACT

A method for operating a non-volatile memory cell device, the method including providing an array of memory array cells connected to word lines and local bit lines, the local bit lines being connected to global bit lines via select transistors, the array being divided into isolated sectors, providing a sense amplifier operative to sense the memory array cells via a sensing path that includes at least one of the local bit lines, at least one of the select transistors, at least one accessed global bit line, and a YMUX, providing a reference cell located in a reference mini-array, the reference cell being connected to the YMUX and being connected to the sense amplifier via another sensing path, driving both the memory array cells and the reference cells with a common bit line (BL) driver connected to the memory array cells and the reference cells via the YMUX through accessed global bit lines, and matching the sensing path of the memory array cell and the sensing path of the reference cell to the sense amplifier by using a non-accessed global bit line in the sensing path between the reference cell and the sense amplifier. The non-accessed global bit line may be dynamically chosen as the global bit line adjacent to the global bit line used for driving both the drains of the array and the reference cells.

7 Claims, 5 Drawing Sheets

U.S. PATENT DOCUMENTS

| | | | |
|---|---|---|---|
| 5,237,213 A | 8/1993 | Tanoi | |
| 5,241,497 A | 8/1993 | Komarek | |
| 5,276,646 A | 1/1994 | Kim et al. | |
| 5,280,420 A | 1/1994 | Rapp | |
| 5,289,412 A | 2/1994 | Frary et al. | |
| 5,295,108 A | 3/1994 | Higa | |
| 5,305,262 A | 4/1994 | Yoneda | |
| 5,335,198 A | 8/1994 | Van Buskirk et al. | |
| 5,345,425 A | 9/1994 | Shikatani | |
| 5,349,221 A | 9/1994 | Shimoji | |
| 5,359,554 A | 10/1994 | Odake et al. | |
| 5,361,343 A | 11/1994 | Kosonocky et al. | |
| 5,381,374 A | 1/1995 | Shiraishi et al. | |
| 5,418,743 A | 5/1995 | Tomioka et al. | |
| 5,450,341 A | 9/1995 | Sawada et al. | |
| 5,450,354 A | 9/1995 | Sawada et al. | |
| 5,477,499 A | 12/1995 | Van Buskirk et al. | |
| 5,508,968 A | 4/1996 | Collins et al. | |
| 5,521,870 A | 5/1996 | Ishikawa | |
| 5,534,804 A | 7/1996 | Woo | |
| 5,537,358 A | 7/1996 | Fong | |
| 5,544,116 A | 8/1996 | Chao et al. | |
| 5,553,030 A | 9/1996 | Tedrow et al. | |
| 5,557,221 A | 9/1996 | Taguchi et al. | |
| 5,559,687 A | 9/1996 | Nicollini et al. | |
| 5,568,085 A | 10/1996 | Eitan et al. | |
| 5,581,252 A | 12/1996 | Thomas | |
| 5,583,808 A | 12/1996 | Brahmbhatt | |
| 5,590,074 A | 12/1996 | Akaogi et al. | |
| 5,612,642 A | 3/1997 | McClintock | |
| 5,627,790 A | 5/1997 | Golla et al. | |
| 5,633,603 A | 5/1997 | Lee | |
| 5,636,288 A | 6/1997 | Bonneville et al. | |
| 5,657,332 A | 8/1997 | Auclair et al. | |
| 5,663,907 A | 9/1997 | Frayer et al. | |
| 5,672,959 A | 9/1997 | Der | |
| 5,675,280 A | 10/1997 | Nomura et al. | |
| 5,694,356 A | 12/1997 | Wong et al. | |
| 5,708,608 A | 1/1998 | Park et al. | |
| 5,712,815 A | 1/1998 | Bill et al. | |
| 5,717,581 A | 2/1998 | Canclini | |
| 5,717,632 A | 2/1998 | Richart et al. | |
| 5,726,946 A | 3/1998 | Yamagata et al. | |
| 5,748,534 A | 5/1998 | Dunlap et al. | |
| 5,754,475 A | 5/1998 | Bill et al. | |
| 5,760,634 A | 6/1998 | Fu | |
| 5,768,193 A | 6/1998 | Lee et al. | |
| 5,771,197 A | 6/1998 | Kim | |
| 5,774,395 A | 6/1998 | Richart et al. | |
| 5,784,314 A | 7/1998 | Sali et al. | |
| 5,805,500 A | 9/1998 | Campardo et al. | |
| 5,808,506 A | 9/1998 | Tran | |
| 5,812,449 A | 9/1998 | Song | |
| 5,812,456 A | 9/1998 | Hull et al. | |
| 5,815,435 A | 9/1998 | Van Tran | |
| 5,828,601 A | 10/1998 | Hollmer et al. | |
| 5,841,700 A | 11/1998 | Chang | |
| 5,847,441 A | 12/1998 | Cutter et al. | |
| 5,861,771 A | 1/1999 | Matsuda et al. | |
| 5,867,429 A | 2/1999 | Chen et al. | |
| 5,880,620 A | 3/1999 | Gitlin et al. | |
| 5,886,927 A | 3/1999 | Takeuchi | |
| 5,903,031 A | 5/1999 | Yamada et al. | |
| 5,910,924 A | 6/1999 | Tanaka et al. | |
| 5,936,888 A | 8/1999 | Sugawara | |
| 5,940,332 A | 8/1999 | Artieri | |
| 5,946,258 A | 8/1999 | Evertt et al. | |
| 5,949,728 A | 9/1999 | Liu et al. | |
| 5,963,412 A | 10/1999 | En | |
| 5,969,993 A | 10/1999 | Takeshima | |
| 5,982,666 A * | 11/1999 | Campardo | 365/185.21 |
| 5,986,940 A | 11/1999 | Atsumi et al. | |
| 6,005,423 A | 12/1999 | Schultz | |
| 6,011,725 A | 1/2000 | Eitan | |
| 6,028,324 A | 2/2000 | Su et al. | |
| 6,034,896 A | 3/2000 | Ranaweera et al. | |
| 6,040,610 A | 3/2000 | Noguchi et al. | |
| 6,044,019 A | 3/2000 | Cernea et al. | |
| 6,044,022 A | 3/2000 | Nachumovsky | |
| 6,064,251 A | 5/2000 | Park | |
| 6,075,402 A | 6/2000 | Ghilardelli et al. | |
| 6,078,518 A | 6/2000 | Chevallier | |
| 6,081,456 A | 6/2000 | Dadashev | |
| 6,084,794 A | 7/2000 | Lu et al. | |
| 6,094,095 A | 7/2000 | Murray et al. | |
| 6,107,862 A | 8/2000 | Mukainakano et al. | |
| 6,108,240 A | 8/2000 | Lavi et al. | |
| 6,118,207 A | 9/2000 | Ormerod et al. | |
| 6,118,692 A | 9/2000 | Banks | |
| 6,128,226 A | 10/2000 | Eitan et al. | |
| 6,130,572 A | 10/2000 | Ghilardelli et al. | |
| 6,130,574 A | 10/2000 | Bloch et al. | |
| 6,134,156 A | 10/2000 | Eitan | |
| 6,147,904 A | 11/2000 | Liron | |
| 6,150,800 A | 11/2000 | Kinoshita et al. | |
| 6,154,081 A | 11/2000 | Pakkala et al. | |
| 6,157,242 A | 12/2000 | Fukui | |
| 6,169,691 B1 | 1/2001 | Pasotti et al. | |
| 6,185,143 B1 | 2/2001 | Perner et al. | |
| 6,188,211 B1 | 2/2001 | Rincon-Mora et al. | |
| 6,198,342 B1 | 3/2001 | Kawai | |
| 6,201,737 B1 | 3/2001 | Hollmer et al. | |
| 6,205,056 B1 | 3/2001 | Pan et al. | |
| 6,208,200 B1 | 3/2001 | Arakawa | |
| 6,215,697 B1 | 4/2001 | Lu et al. | |
| 6,222,762 B1 | 4/2001 | Guterman et al. | |
| 6,233,180 B1 | 5/2001 | Eitan et al. | |
| 6,240,040 B1 | 5/2001 | Akaogi et al. | |
| 6,246,555 B1 | 6/2001 | Tham | |
| 6,252,799 B1 | 6/2001 | Liu et al. | |
| 6,282,133 B1 | 8/2001 | Nakagawa et al. | |
| 6,285,246 B1 | 9/2001 | Basu | |
| 6,285,589 B1 | 9/2001 | Kajitani | |
| 6,285,614 B1 | 9/2001 | Mulatti et al. | |
| 6,297,974 B1 | 10/2001 | Ganesan et al. | |
| 6,307,807 B1 | 10/2001 | Sakui et al. | |
| 6,324,094 B1 | 11/2001 | Chevallier | |
| 6,331,950 B1 | 12/2001 | Kuo et al. | |
| 6,339,556 B1 * | 1/2002 | Watanabe | 365/210 |
| 6,351,415 B1 * | 2/2002 | Kushnarenko | 365/185.18 |
| 6,353,356 B1 | 3/2002 | Liu | |
| 6,353,554 B1 | 3/2002 | Banks | |
| 6,356,469 B1 | 3/2002 | Roohparvar et al. | |
| 6,359,501 B1 | 3/2002 | Lin et al. | |
| 6,385,086 B1 | 5/2002 | Mihara et al. | |
| 6,400,209 B1 | 6/2002 | Matsuyama et al. | |
| 6,407,537 B1 | 6/2002 | Antheunis | |
| 6,433,624 B1 | 8/2002 | Grossnickle et al. | |
| 6,452,438 B1 | 9/2002 | Li | |
| 6,469,929 B1 * | 10/2002 | Kushnarenko et al. | 365/185.06 |
| 6,469,935 B1 | 10/2002 | Hayashi | |
| 6,496,414 B1 | 12/2002 | Kasa et al. | |
| 6,510,082 B1 | 1/2003 | Le et al. | |
| 6,519,180 B1 | 2/2003 | Tran et al. | |
| 6,522,585 B1 | 2/2003 | Pasternak | |
| 6,525,969 B1 | 2/2003 | Kurihara et al. | |
| 6,529,412 B1 * | 3/2003 | Chen et al. | 365/185.21 |
| 6,535,020 B1 | 3/2003 | Yin | |
| 6,535,434 B1 | 3/2003 | Maayan et al. | |
| 6,552,387 B1 | 4/2003 | Eitan | |
| 6,574,139 B1 | 6/2003 | Kurihara | |
| 6,577,514 B1 | 6/2003 | Shor et al. | |
| 6,577,532 B1 | 6/2003 | Chevallier | |
| 6,594,181 B1 | 7/2003 | Yamada | |

| | | |
|---|---|---|
| 6,608,526 B1 | 8/2003 | Sauer |
| 6,614,295 B1 | 9/2003 | Tsuchi |
| 6,624,672 B1 | 9/2003 | Confaloneri et al. |
| 6,627,555 B1 | 9/2003 | Eitan et al. |
| 6,636,440 B1 | 10/2003 | Maayan et al. |
| 6,639,837 B1 | 10/2003 | Takano et al. |
| 6,643,178 B1 | 11/2003 | Kurihara |
| 6,650,568 B1 | 11/2003 | Iijima |
| 6,654,296 B1 | 11/2003 | Jang et al. |
| 6,665,769 B1 | 12/2003 | Cohen et al. |
| 6,677,805 B1 | 1/2004 | Shor et al. |
| 6,731,542 B1 * | 5/2004 | Le et al. ............... 365/185.21 |
| 6,917,544 B1 * | 7/2005 | Maayan et al. ........ 365/185.33 |
| 6,937,523 B1 * | 8/2005 | Eshel .................... 365/185.28 |
| 2002/0004878 A1 | 1/2002 | Norman |
| 2002/0034097 A1 | 3/2002 | Banks |
| 2002/0071313 A1 | 6/2002 | Takano et al. |
| 2002/0132436 A1 | 9/2002 | Eliyahu et al. |
| 2002/0145465 A1 | 10/2002 | Shor et al. |
| 2002/0191465 A1 | 12/2002 | Maayan et al. |
| 2003/0076159 A1 | 4/2003 | Shor et al. |
| 2003/0117841 A1 | 6/2003 | Yamashita |
| 2003/0117861 A1 | 6/2003 | Maayan et al. |
| 2003/0142544 A1 | 7/2003 | Maayan et al. |
| 2003/0202411 A1 | 10/2003 | Yamada |
| 2003/0208663 A1 | 11/2003 | Van Buskirk et al. |
| 2003/0214844 A1 | 11/2003 | Iijima |
| 2004/0008541 A1 | 1/2004 | Maayan et al. |
| 2004/0012993 A1 | 1/2004 | Kurihara |
| 2004/0013000 A1 | 1/2004 | Torii |
| 2004/0151034 A1 | 8/2004 | Shor et al. |

FOREIGN PATENT DOCUMENTS

| | | |
|---|---|---|
| EP | 0740307 | 10/1996 |
| EP | 0 843 398 | 5/1998 |
| EP | 1 071 096 | 1/2001 |
| EP | 1126468 | 8/2001 |
| EP | 1164597 | 12/2001 |
| EP | 0 656 628 | 4/2003 |
| JP | 408106791 | 4/1996 |
| JP | 10 334676 | 12/1998 |
| JP | 02001118392 | 4/2001 |
| JP | 02002216488 | 8/2002 |
| WO | WO 03/036651 | 6/2000 |
| WO | WO 00/46808 | 8/2000 |
| WO | WO 03/063168 | 7/2003 |
| WO | WO 03/088261 | 10/2003 |

OTHER PUBLICATIONS

Klinke, et al., "A Very-High-Slew-Rate CMOS Operational Amplifier", IEEE Journal of Solid-State Circuits, 1989, pp. 744-746, vol. 24.

Shor, et al., "paper WA2.04.01—Self Regulated Four Phased Charge Pump with Boosted Wells", ISCAS 2002, 2002.

Fotouhi, "An Efficient CMOS Line Driver for 1.544-Mb/s T1 and 2.048-Mb/s E1 Applications", IEEE Journal of Solid-State Circuits, 2003, pp. 226-236, vol. 38.

* cited by examiner

DYNAMIC MATCHING OF SIGNAL PATH AND REFERENCE PATH FOR SENSING

FIELD OF THE INVENTION

The present invention generally relates to AC sensing schemes used for memory systems, such as flash memories, and particularly to a method for dynamic matching of the reference signal path and the sensed cell path without any area penalty, by using a non-accessed path in the array.

BACKGROUND OF THE INVENTION

Reading the contents of memory cells generally involves sensing the current or voltage of the cell. Many kinds of sensing schemes are known in the art for memory cell arrays, such as flash or other non-volatile memories. One type of sensing scheme involves comparing the sensed cell to a reference cell.

Reference is now made to FIG. 1, which illustrates a prior art example of an AC matching scheme between an array sensed cell and a reference cell.

As is well known in the art, a typical memory cell (e.g., virtual ground) array 10, such as non-volatile memory (NVM) cell array, may include a plurality of memory cells 12 connected to word lines and to local bit lines 16. The local bit lines 16 may be connected to global bit lines (GBLs) 18 via select transistors 20. The array 10 may be divided into one or more sectors 22, such as by means of isolation zones. The isolated slices 22 may be segmented in the bit line direction by the select transistors 20, and the select transistors 20 may be arranged in distinct areas in the array 10. This segmentation creates isolated physical sectors. More than one physical sector may share common global bit lines 18. Memory cells 12 in physical sectors that share the same global bit lines 18 may not interact due to the isolating select transistors 20.

A bit line (BL) driver 24 drives the drain side of the sensed cell 12. The BL driver 24 is connected to the sensed cell 12 via a YMUX (Y multiplexer) 26, via a driving path that includes one of the GBLs 18, one of the select transistors 20 and one of the local bit lines 16, which, in this case, serves as a drain diffusion bit-line (DBL). The connecting line to which the select transistor 20 is connected is referred to as select line 14 (designated as select line SEL [8:0] in FIG. 1), and the connecting line in the YMUX 26 is referred to as the BS line.

A sense amplifier 28 senses the source side of the sensed cell 12. The path from the source of the sensed cell 12 to the sense amplifier 28 is through one of the local bit lines 16, which, in this case, serves as a source diffusion bit-line, one of the select transistors 20, one of the GBLs 18 and the YMUX 26.

A reference cell 30 is used for the sense amplifier 28. The reference cell 30 is located in a reference mini-array 32. To match the path of the reference cell 30 to that of the sensed cell 12, a matched reference BL (REF-BL) driver 34 is used in conjunction with a reference YMUX (REF-YMUX) 36, reference select transistors 38 (also referred to as ref-select transistors) and matched reference DBLs (REF-DBL) 40. Since most of the capacitance of the array cell path is the GBL capacitance (due to both to GND and coupling capacitance), reference GBLs (REF-GBLs) 42 are used to load the source side and the drain side of the reference path. The connecting line to which the ref-select transistor 38 is connected is referred to as the REF_SEL line, and the connecting line in the YMUX 36 is referred to as the REF_BS line.

Such a reference scheme is described in U.S. Pat. No. 6,535,434, to Maayan, Sofer, Eliyahu and Eitan, assigned to the same assignee of the present application, the disclosure of which is incorporated herein by reference. In brief, U.S. Pat. No. 6,535,434 describes an architecture and method for implementing a non-strobed operation on an array cell, in which a reference unit is provided for emulating the response of the array cell during a desired operation (e.g., read, program verify, erase verify or other types of read operations). The architecture and method permit relatively noise-free array cell interrogations at close to ground voltage levels.

The read operation is performed by means of selecting the appropriate BS and SEL lines connecting the drain side of the array cell 12 to the BL driver 24 (at node BL_D) and by means of enabling the appropriate BS and SEL lines connecting the source side of the array cell 12 to the sense amplifier 28 (at node BL_S). In addition the same procedure is applied for the reference cell 30, i.e. enabling the appropriate REF_SEL and REF_BS lines to supply drain voltage from the REF_BL driver 34 (at node REF_BL_D) and connecting the source side of the reference cell 30 to the sense amplifier 28 (at node BL_REF). Once all nodes stabilize, the sensing period starts by floating the sense amplifier (SA) inputs. This leads to charging of the SA inputs by the array cell 12 and the reference cell 30, respectively.

Reference is now made to FIG. 2, which illustrates the signals generated at the inputs of the SA 28 with a 1C:1C load capacitance ratio matching scheme. "1C:1C load capacitance ratio matching" means that the capacitance for the sensed cell path and the capacitance for the reference signal path are fully matched. Time T1 represents the time of stabilization of the different nodes. Between the times T1 and T2, the signals BL_S and BL_REF are generated respectively by the array cell 12 and the reference cell 30 charging the total path capacitance. The difference between the signals BL_S and BL_REF depends only on the different programming level of the cells 12 and 30. The reference cell 30 is programmed so that its current level would be between a programmed array cell and an erased array cell. Between times T2 and T3, a decision circuit is used for providing logical output describing the analog output of the SA 28.

In the above-described sensing scheme, the matching between the reference path and the sensed cell path is maintained by copying the sensed cell path to the reference path. This has the disadvantage of multiplying the power dissipation during the sensing period and has a large area penalty. Specifically, in the illustrated example of FIG. 1, the area penalty is two GBLs 18 per sense amplifier 28 and the power penalty is due to the need to drive two drain side GBLs for each read sequence.

SUMMARY OF THE INVENTION

The present invention seeks to provide AC sensing schemes used for memory systems such as but not limited to, flash memories. As described more in detail further below, present invention seeks to provide dynamic matching of the reference signal path and the sensed cell path without any area penalty, by using a non-accessed path in the array. For example, instead of using designated REF_GBLs for the matching, an unused GBL from the array may be used for the source side matching. Furthermore, the drain side GBL already used for the array cell may also be used for the reference cell.

There is thus provided in accordance with an embodiment of the present invention a method for operating a non-volatile memory cell device, the method including providing an array of memory array cells connected to word lines and local bit lines, the local bit lines being connected to global bit lines via select transistors, the array being divided into isolated sectors, providing a sense amplifier operative to sense the memory array cells via a sensing path that includes at least one of the local bit lines, at least one of the select transistors, at least one accessed global bit line, and a YMUX, providing a reference cell located in a reference mini-array, the reference cell being connected to the YMUX and being connected to the sense amplifier via another sensing path, driving both the memory array cells and the reference cells with a common bit line (BL) driver connected to the memory array cells and the reference cells via the YMUX through accessed global bit lines, and matching the sensing path of the memory array cell and the sensing path of the reference cell to the sense amplifier by using a non-accessed global bit line in the sensing path between the reference cell and the sense amplifier. The non-accessed global bit line may be dynamically chosen as the global bit line adjacent to the global bit line used for driving both the drains of the array and the reference cells.

In accordance with an embodiment of the present invention the method further includes matching a coupling signal between the drain and source sides of the memory array cell and the reference cell by using a neighboring, non-accessed global bit line as the reference global bit line. The capacitances of the sensing path of the memory array cell and of the sensing path of the reference cell may be fully matched 1C:1C.

Further in accordance with an embodiment of the present invention the sensing includes source side sensing, wherein the sense amplifier senses the source sides of the memory array cells, the accessed global bit line serving as a global source bit line, and wherein the common bit line (BL) driver drives drain sides of the memory array cells and the reference cells through the accessed global bit lines serving as global drain bit lines.

Still further in accordance with an embodiment of the present invention sensing a bit of one of the memory array cells includes using the local bit line to which a first side of the memory array cell is connected as the local drain bit line, and the local bit line to which a second side of the memory array cell is connected as the local source bit line, connecting the local drain bit line via one of the select transistors to a global bit line, this global bit line becoming the drain global bit line, and connecting the local source bit line via another of the select transistors to another global bit line, this global bit line becoming the source global bit line, connecting the drain global bit line to a reference drain bit line via a ref-select transistor, the drain side of the reference cell of the reference mini-array being connected to the reference drain bit line, connecting another global bit line which is adjacent to the drain global bit line on the opposite side from the source global bit line to a reference source bit line via another ref-select transistor, the source side of the reference cell of the reference mini-array being connected to the reference source bit line, and blocking the global bit line, which is connected to the reference source bit line, from being connected to the array of memory array cells.

BRIEF DESCRIPTION OF THE DRAWINGS

The present invention will be understood and appreciated more fully from the following detailed description taken in conjunction with the drawings in which.

DETAILED DESCRIPTION OF EMBODIMENTS

Figure 3:
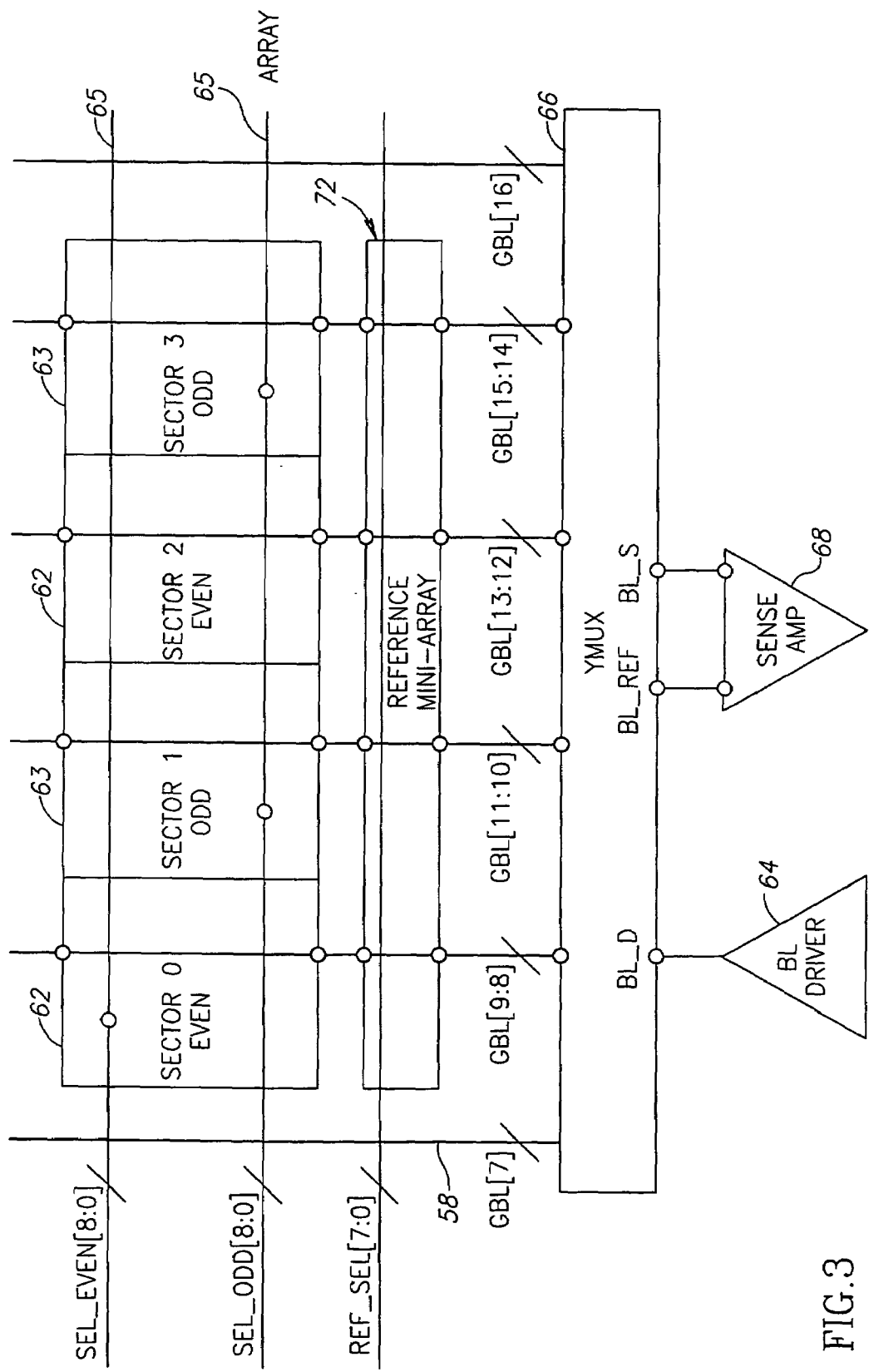
FIG. 3 is a simplified schematic block diagram of a sensing scheme, for matching a reference path to an array path associated with a sense amplifier, in accordance with an embodiment of the present invention.
Figure 4:
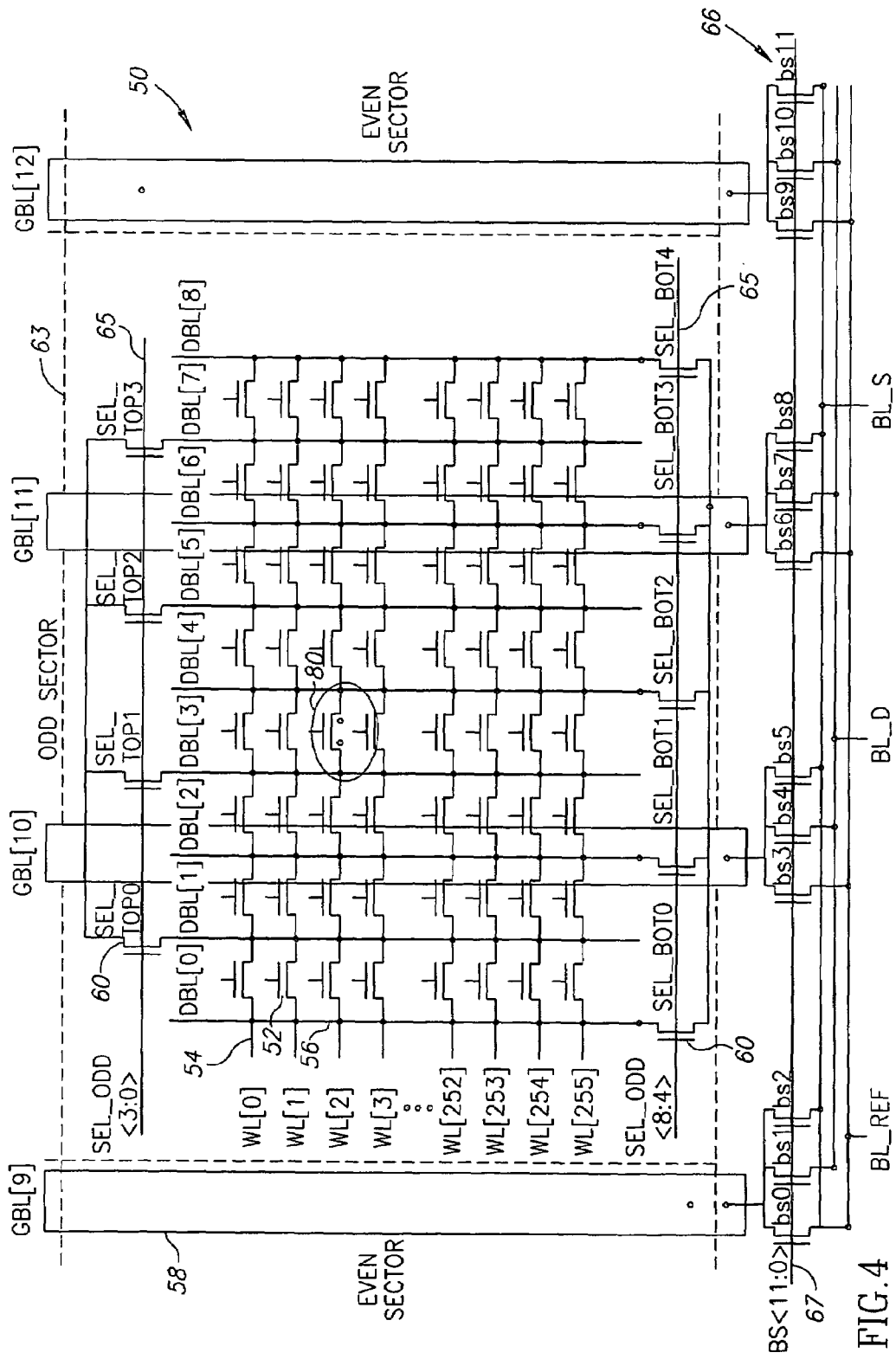
FIG. 4 is a simplified schematic illustration of the array in accordance with an embodiment of the present invention, showing a detailed connection of an odd sector, its global bit lines and two neighboring global bit lines (from even sectors) to the YMUX.
Figure 5:
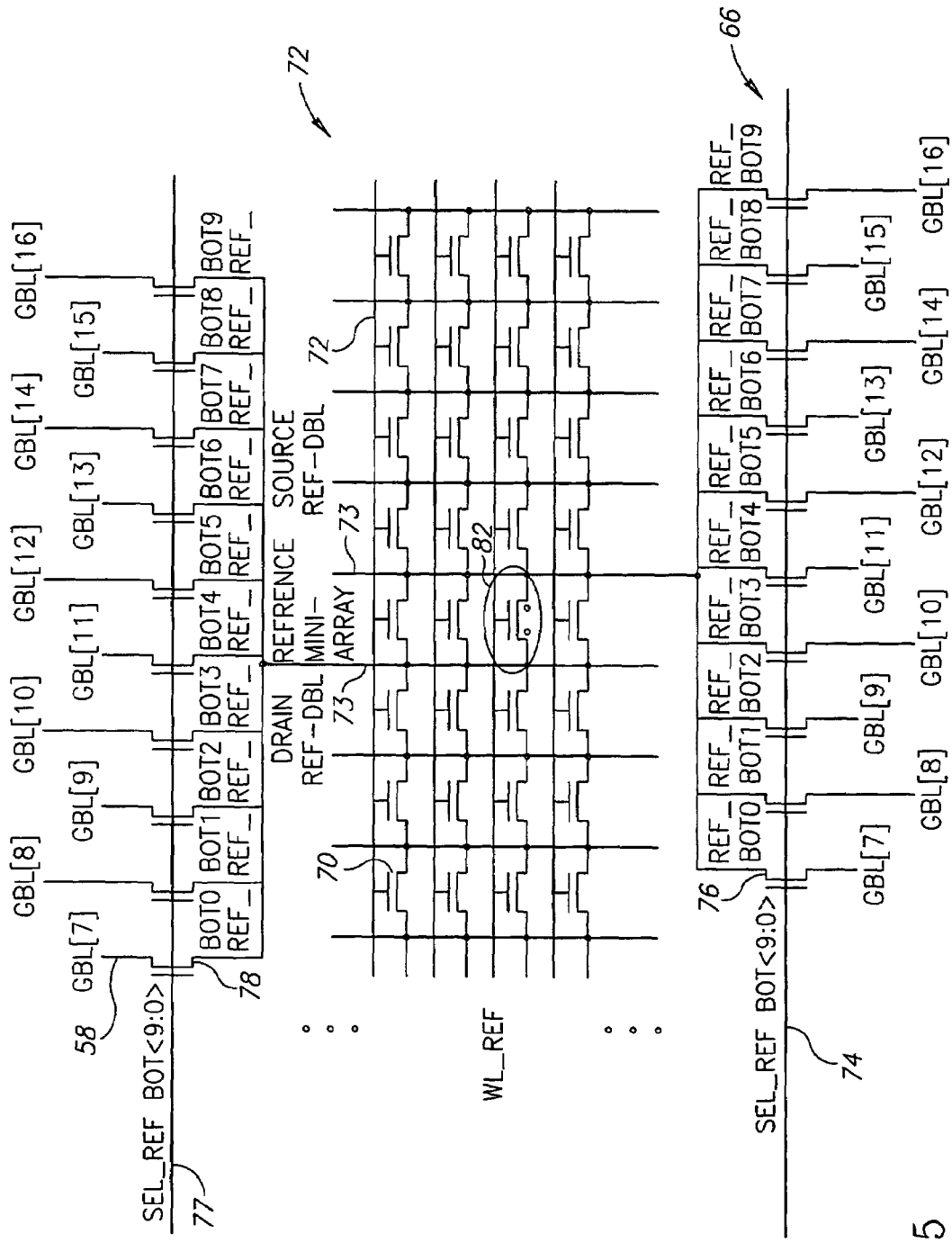
FIG. 5 is a simplified schematic illustration of the reference mini-array in accordance with an embodiment of the present invention, showing a detailed connection of the reference mini-array to the global bit lines.

Reference is now made to FIGS. 3, 4 and 5, which illustrate a sensing scheme for matching a reference path to an array path associated with a sense amplifier, in accordance with an embodiment of the present invention.

A non-volatile memory cell array 50 is shown, which may include a plurality of memory cells 52 connected to word lines 54 and local bit lines 56 (FIG. 4). The local bit lines 56 are designated by the nomenclature DBL in the drawings. The word lines 54 are designated by the nomenclature WL in the drawings. The local bit lines 56 may be connected to GBLs 58 via select transistors 60 (sel_top and sel_bot in FIG. 4). The array 50 may be divided into sectors or slices (discussed further hereinbelow), such as by means of isolation zones.

A BL driver 64 (FIG. 3) may drive the drain side of the sensed memory cell 52. The BL driver 64 may be connected to the sensed cell 52 via a YMUX 66, via a driving path that includes one of the GBLs 58, one of the select transistors 60 and one of the local bit lines 56. The connecting line to which the sensed cell 52 is connected is referred to as the select (SEL) line 65, and the connecting line in the YMUX 66 is referred to as BS line 67 (FIG. 4) to which are connected YMUX transistors 69 (designated as bs0, bs1, etc. in FIG. 4).

A sense amplifier 68 (FIG. 3) may sense the source side of the sensed cell 52. The path from the source of the sensed cell 52 to the sense amplifier 68 may be through one of the local bit lines 56, one of the select transistors 60, one of the GBLs 58 and the YMUX 66.

Reference is now made additionally to FIG. 5. A reference cell 70 may be used for the sense amplifier 68. The reference cell 70 may be located in a reference mini-array 72, which may include word lines 71 and bit lines 73. Unlike the prior art, the present invention obviates the need for a separate reference bit line driver and a separate reference YMUX.

Instead, the reference mini-array 72 may be connected to the same YMUX 66 via a connecting line 74, referred to as sel_ref_bot, and reference select transistors 76 (ref_bot). The reference mini-array 72 may be connected to the global bit lines of the array 50 via reference select transistors 76 and 78, which are selected respectively by reference select lines 74 and 77. Reference select line 74 is also referred to as sel_ref_bot, and reference select line 77 is also referred to as sel_ref_top. The same bit line driver 64 may be used to drive the bit lines for both the array cells 52 and the reference cells 70.

For convenience of explanation, the array sectors may be divided into first and second sectors, referred to as even and odd sectors 62 and 63, respectively. In contrast to the prior art, the even and odd sectors 62 and 63 have separate even and odd select lines 65. Thus, the number of select lines 65 is doubled, providing separate access to the even and odd sectors 62 and 63.

As in the prior art, each of the global bit lines 58 can be selected as a drain or source side for the array cell 52 by the YMUX 66. In addition, each of the global bit lines 58 of the sense amplifier 68, plus two neighboring global bit lines from a neighboring sense amplifier, may also be connected to the reference mini-array 72 through the reference select transistors 76 and 78. The YMUX 66 may connect the array cells 52 and the reference cell 70 to the sense amplifier 68 using nodes BL_S and BL_REF, respectively. In addition, the YMUX 66 may connect the bit line driver 64 for both the array cells 52 and the reference cell 70 through node BL_D.

An example of achieving dynamic 1C:1C matching in accordance with an embodiment of the invention is now explained with particular reference to FIG. 4, which shows one of the odd sectors 63. The explanation follows for an exemplary array cell 80, marked by a circle in FIG. 4, which is sensed with respect to an exemplary reference cell 82, marked by a circle in FIG. 5. The array cell 80 and the reference cell 82 are both dual bit cells, each having right and left bits.

Sensing the bit on the right hand side means using the bit line DBL[3] as the drain bit line, and the bit line DBL[4] as the source bit line. Accordingly, this involves connecting the bit line DBL[3] to the BL driver 64 via node BL_D, and connecting the bit line DBL[4] to the sense amplifier 68 via node BL_S. This is achieved by activating the select transistors 60, sel_top1 and sel_bot2, using the appropriate sel_odd lines 65. The global bit line GBL[10] is used as the drain GBL, while the global bit line GBL[11] is used as the source GBL, this being implemented by activating the YMUX transistors bs4 and bs8, which respectively connect global bit line GBL[10] to node BL_D and global bit line GBL[11] to node BL_S. The global bit line GBL[10] drives the drain side of both the array cell 80 and the reference cell 82.

Referring now to FIG. 5, which shows the connection of the GBLs 58 to the reference mini-array 72, global bit line GBL[10] is connected to the drain bit line 73 designated Drain REF_DBL, implemented by activating the ref_top3 select transistor 78. To maintain a complete matching, the global bit line GBL[9] is selected to be the global bit line that loads the source side of the reference cell 82 (i.e. connecting to the source bit line 73 designated source REF-DBL). The global bit line GBL[9] is selected because both global bit lines GBL[9] and GBL[11] are neighbors of the global bit line GBL[10]. This not only provides matching of the capacitance to ground, but also provides a full match of the coupling between drain and source of the array cell 80 and the reference cell 82.

The global bit line GBL[9] may be selected and connected to the Ref-Source DBL by activating ref-select transistor 76 ref_bot2. The connection of GBL[9] to the array 50 must be blocked and this may be achieved simply by the aforementioned partition of even and odd sectors. Thus, the connection of GBL[9] to the array 50 may be blocked by de-activating the sel_even lines. Finally, the global bit line GBL[9] may be connected to the sense amplifier 68 via node BL-REF by activating transistor 69 bs0 in the YMUX 66.

Sensing the left side bit of array cell 80 means using the bit line DBL[4] as the drain bit line, and the bit line DBL[3] as the source bit line. Accordingly, this involves connecting the bit line DBL[3] to the sense amplifier 68 via node BL_S, and connecting the bit line DBL[4] to the BL driver 64 via node BL_D. This is achieved by activating the select transistors 60, sel_top1 and sel_bot2, using the appropriate sel_odd lines 65. The global bit line GBL[10] is used as the source GBL, while the global bit line GBL[11] is used as the drain GBL, this being implemented by activating the YMUX transistors bs7 and bs5, which respectively connect global bit line GBL[11] to node BL_D and global bit line GBL[10] to node BL_S. The global bit line GBL[11] drives the drain side of both the array cell 80 and the reference cell 82.

The global bit line GBL[11] is connected to the drain bit line 73 designated Drain REF_DBL, implemented by activating the ref_top4 select transistor 78. To maintain a complete matching, the global bit line GBL[12] is selected to be the global bit line that loads the source side of the reference cell 82 (i.e. connecting to the source bit line 73 designated source REF-DBL). The global bit line GBL[12] is selected because both global bit lines GBL[10] and GBL[12] are neighbors of the global bit line GBL[11].

The global bit line GBL[12] may be selected and connected to the Ref-Source DBL by activating ref-select transistor 76 ref_bot5. The connection of GBL[12] to the array 50 may be blocked by de-activating the sel_even lines. Finally, the global bit line GBL[12] may be connected to the sense amplifier 68 via node BL-REF by activating transistor 69 bs9 in the YMUX 66.

Figure 1:
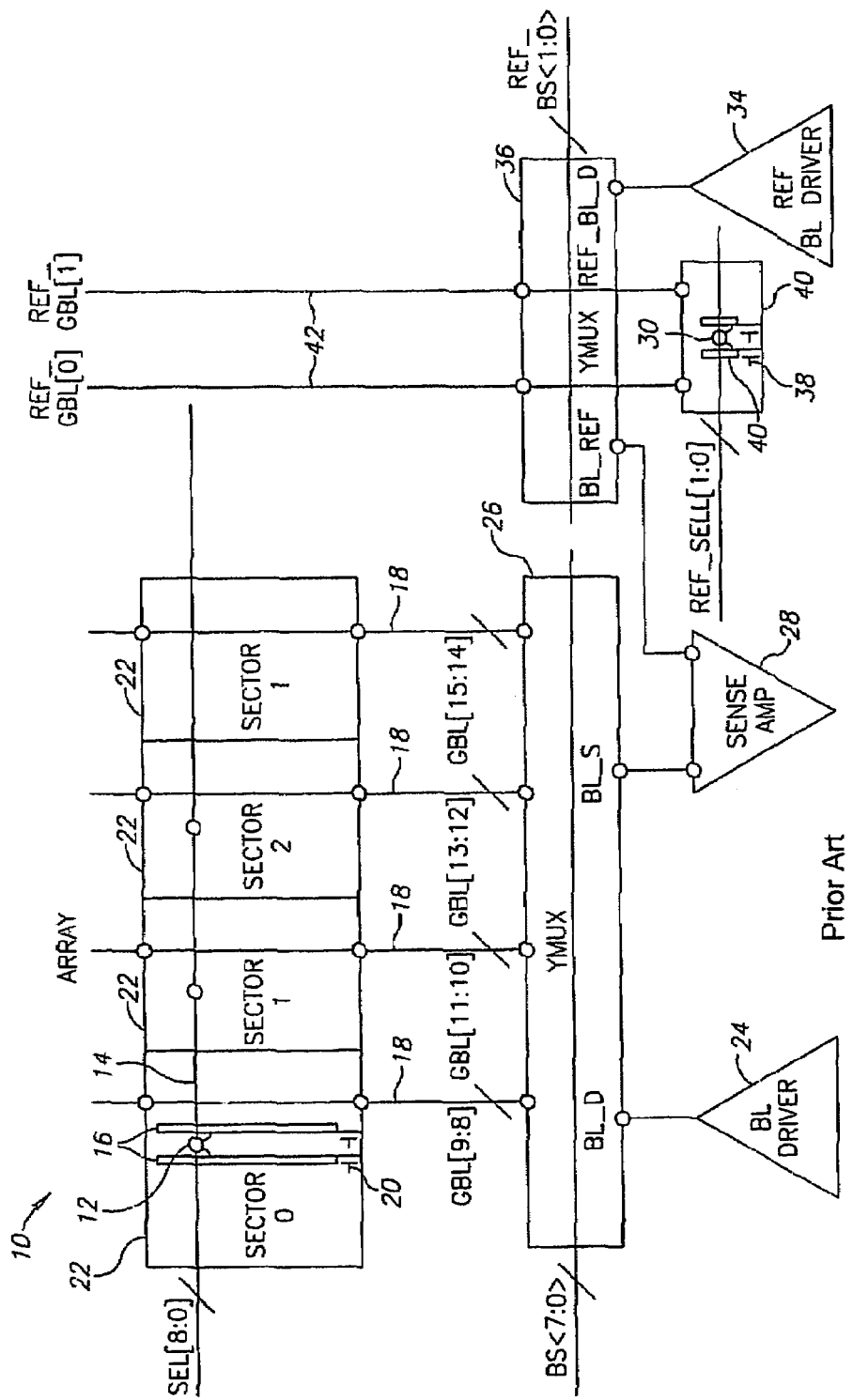
FIG. 1 is a simplified schematic block diagram of a prior-art sensing scheme with designated global bit lines (GBLs) for matching a reference path to an array path associated with a sense amplifier. Array sectors, YMUX and BL-driver are shown for the array and Mini-Array, Ref-YMUX and REF-BL driver are shown for the reference.
Figure 2:
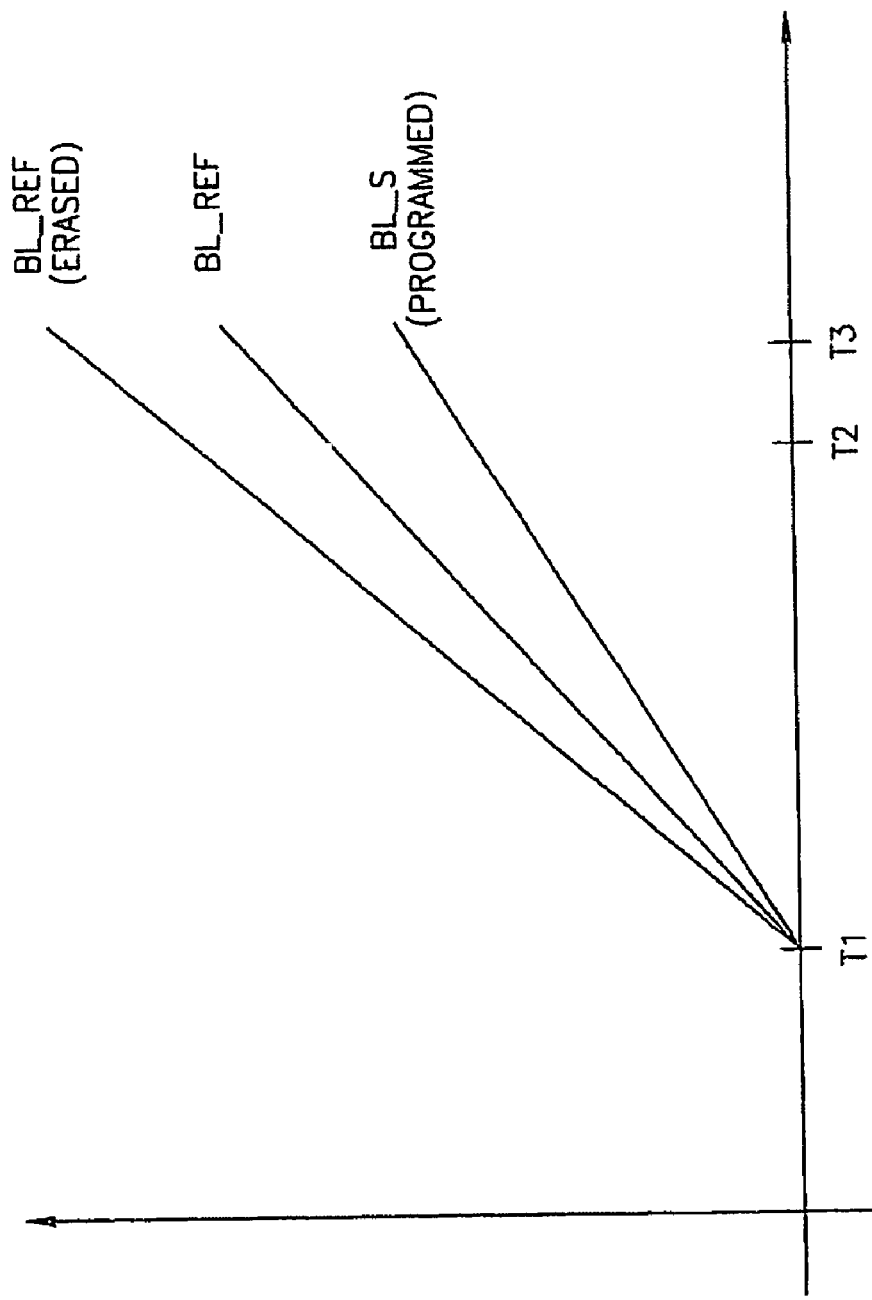
FIG. 2 is a simplified graph of prior-art waveforms of sense amplifier input signals, showing erased and programmed cells as opposed to a reference cell. For 1C:1C matching, the difference in cell current is translated to a difference in voltage level.

The resulting signals generated at the sense amplifier inputs would be the same as the ones shown for the prior art in FIG. 2. No timing penalty or difference is expected.

Some of the advantages of the present invention over the prior art include, without limitation, full capacitance matching, area reduction and power reduction. As described above, the matching may be achieved by using a common drain drive for the array cell and the reference cell, matching the capacitance to ground by using a non-accessed global bit line as a load to the source side of the reference cell, and/or matching the coupling signal between the drain and source by using the neighboring, non-accessed global bit line as the reference global bit line. Using a non-accessed global bit line from the array as the reference global bit line may reduce "real estate" in the chip by eliminating the need for additional reference global bit lines. The power consumption may be reduced by driving only one drain global bit line for both the array cell and the reference cell as opposed to the prior art which drives two separate global bit lines, one for the array cell and another for the reference cell.

The present invention may require additional select transistors for the reference mini-array 72, as well as additional decoding for the separate even and odd select lines 65, which is a small penalty compared to the total outcome.

It will be appreciated by persons skilled in the art that the present invention is not limited by what has been particularly shown and described hereinabove. Rather the scope of the present invention includes both combinations and subcombinations of the features described hereinabove as well as modifications and variations thereof which would occur to a person of skill in the art upon reading the foregoing description and which are not in the prior art.

What is claimed is:

1. A method for operating a non-volatile memory cell device, the method comprising:

providing an array of memory array cells connected to word lines and local bit lines, said local bit lines being connected to global bit lines via select transistors, said array being divided into isolated sectors;

providing a sense amplifier operative to sense the memory array cells via a sensing path that includes at least one of the local bit lines, at least one of the select transistors, at least one accessed global bit line, and a YMUX (Y multiplexer);

providing a reference cell located in a reference mini-array, said reference cell being connected to said YMUX and being connected to said sense amplifier via another sensing path;

driving both the memory array cells and the reference cell with a common bit line (BL) driver connected to the memory array cells and the reference cells via said YMUX through accessed global bit lines; and matching the sensing path of the memory array cell and the sensing path of the reference cell to the sense amplifier by using a non-accessed global bit line in the sensing path between the reference cell and the sense amplifier.

2. The method according to claim 1, wherein the non-accessed global bit line is dynamically chosen as the global bit line adjacent to the global bit line used for driving both the drains of the array and the reference cells.

3. The method according to claim 1, further comprising matching a coupling signal between a drain and source of the memory array cell and the reference cell by using a neighboring, non-accessed global bit line as a reference global bit line.

4. The method according to claim 3, wherein capacitances of the sensing path of the memory array cell and of the sensing path of the reference cell are fully matched.

5. The method according to claim 1, wherein the sensing comprises source side sensing, wherein said sense amplifier senses the source sides of the memory array cells, the accessed global bit line serving as a global source bit line, and wherein said common bit line (BL) driver drives drain sides of the memory array cells and the reference cells through the accessed global bit lines serving as global drain bit lines.

6. The method according to claim 1, wherein the memory array cells and the reference cell comprise dual bit cells, each having a right side bit and a left side bit.

7. The method according to claim 6, wherein sensing a bit of one of the memory array cells comprises:

using a local bit line to which a first side of the memory array cell is connected as the local drain bit line, and the local bit line to which a second side of the memory array cell is connected as the local source bit line;

connecting the local drain bit line via one of the select transistors to a global bit line, this global bit line becoming the drain global bit line, and connecting the local source bit line via another of the select transistors to another global bit line, this global bit line becoming the source global bit line;

connecting the drain global bit line to a reference drain bit line via a ref-select transistor, the drain side of the reference cell of the reference mini-array being connected to the reference drain bit line;

connecting another global bit line which is adjacent to the drain global bit line on the opposite side from the source global bit line to a reference source bit line via another ref-select transistor, the source side of the reference cell of the reference mini-array being connected to the reference source bit line; and blocking the global bit line, which is connected to the reference source bit line, from being connected to the array of memory array cells.

* * * * *